March 8, 1966 D. L. HEDGER 3,239,692
GATE CIRCUIT WHICH USES THE OUTPUT SIGNAL TO CONTROL BIAS OF AN INPUT TRIGGER CIRCUIT
Filed Oct. 31, 1963
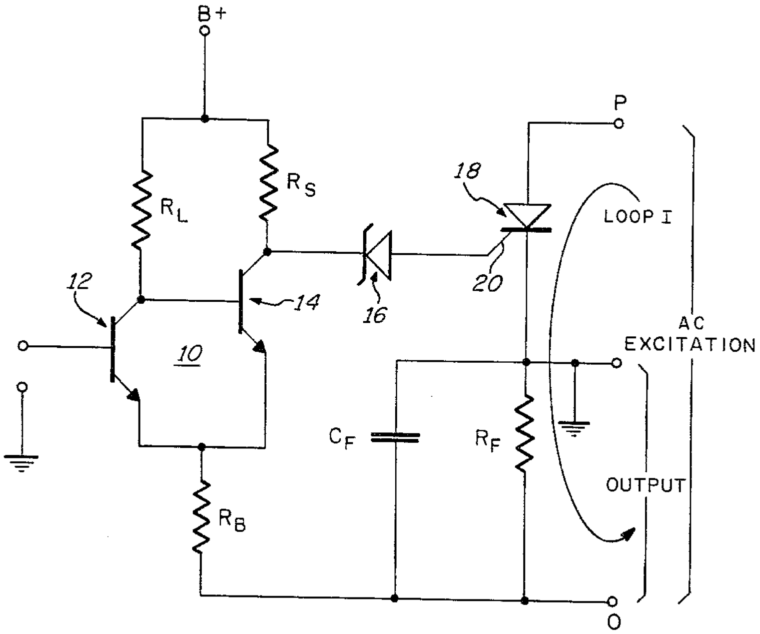
INVENTOR.
DONALD L. HEDGER
BY
S. C. Yeaton
ATTORNEY

United States Patent Office 3,239,692

Patented Mar. 8, 1966

3,239,692

GATE CIRCUIT WHICH USES THE OUTPUT SIGNAL TO CONTROL BIAS OF AN INPUT TRIGGER CIRCUIT

Donald L. Hedger, Phoenix, Ariz., assignor to Sperry Rand Corporation, Great Neck, N.Y., a corporation of Delaware Filed Oct. 31, 1963, Ser. No. 320,441

5 Claims. (Cl. 307—88.5)

This invention relates to control circuits and more particularly to a circuit adapted to apply power to a controllable device in response to an input control signal of one particular level, and then remove such power when the control signal changes to a particular different lower level.

In providing the invention, use is made of a threshold device, e.g., a zener diode, adapted to conduct when its applied signal level exceeds at least a particular signal level. When conducting, the threshold device applies its output signal to open a gate, e.g. a silicon control rectifier (S.C.R.), for applying power to the aforesaid controllable device. However, by use of a trigger circuit such as the Schmitt circuit shown and described in Transistor Circuit Design, McGraw Hill Book Company Inc., New York (Library of Congress Catalog Card No. 62–19766), on page 381, assurance may be had that the threshold circuit conducts only when the trigger circuit abruptly switches, i.e. when a normally conducting transistor is turned off in response to one particular applied control signal level; by further using a bias derived from the power which is applied to the controllable device, the signal level at which the trigger circuit itself switches to turn the normally conducting transistor back on may be lowered. Hence, abrupt application of power (to the controllable device) at one applied control signal level, and removal of same for a different signal level is attained.

The bias derived from the aforementioned power source is of such a nature that, while decaying after the input signal falls below the aforesaid lower particular level, it enhances the abruptness with which the normally conducting transistor is turned back on to remove thereby power from the controllable device. This will be described in more detail later.

A principal object of the invention is to provide a circuit for use in applying power to a controllable device.

Another object of the invention is to provide apparatus for first responding to one signal level to apply power to a device and then responding to a lower level of that signal to remove power from the device.

Another object of the invention is to provide apparatus that uses the output signal from a gate circuit as a bias for changing the switching point for a trigger circuit, such latter circuit in turn operating to control the gate circuit itself.

Another object is to provide apparatus that uses the output signal from a gate circuit as a bias for changing the switching point for a trigger circuit, such latter circuit in turn operating to control the gate circuit itself while at the same time having its switching operation enhanced by the provided bias.

Still another object of the invention is to provide apparatus that utilizes in combination a Schmitt trigger circuit, a zener diode, and a silicon control rectifier to regulate application of power to a controllable device in such a way that power is applied thereto for one level of a control signal and removed therefrom for another lower level of that signal.

The invention will be described with reference to the figure which is a schematic diagram of a circuit embodying the invention.

Referring now to the figure, a Schmitt trigger circuit 10 consisting among other things of a transistor 12 and a transistor 14 is so adapted that the transistor 14 is normally conducting and the transistor 12 is normally nonconducting. In the collector circuits of the transistors 12 and 14 are resistors $R_L$ and $R_S$ respectively. The resistor $R_L$ is of a larger resistance than the resistor $R_S$. A common resistor $R_B$ serves as a biasing resistor for both transistors 12 and 14, and the transistor 12 is adapted to have a control signal applied between its base and ground.

Connected to the collector of the transistor 14 is a zener diode 16 which is biased backwardly by a positive potential appearing at the transistor 14 collector. A silicon control rectifier 18 (S.C.R.) adapted to have its anode connected to receive power from a contact P has its control electrode 20 connected to the anode of the zener diode 16. The cathode of the control rectifier 18 is grounded, being connected also to a network consisting of a capacitor $C_F$ and a resistor $R_F$. The resistor $R_F$ and the capacitor $C_F$ are in turn connected both to an output terminal O and to the bias resistor $R_B$. Power, application of which is to be controlled, is adapted to be applied across the contacts P and O.

Operation: The transistor 14 is the normally conducting transistor and the transistor 12 is the normally nonconducting transistor for the reason that the respective resistances $R_S$ and $R_L$ are unequal. That is, the transistor 14 at the instant the circuit is energized conducts heavily to cause the bias resistor $R_B$ to operate to cut off the transistor 12. With such the case, the potential at the collector of the transistor 14 is at a sufficiently low positive potential to prevent the zener diode 16 from conducting. Therefore, the control rectifier 18 has no signal applied to its control electrode 20, and power cannot flow through such rectifier to provide an output appearing between contact O and ground.

On application of a positive going control signal to the input of the transistor 12, its base gradually reaches a point at which it fires the transistor 12 into conduction. As this happens, the potential at the base of the transistor 14 falls rapidly and operates to cut off the transistor 14, thereby causing the voltage at the collector of the transistor 14 to rise rapidly. As a result of this, the zener threshold for the diode 16 is reached, which fact causes a positive potential to be applied to the control electrode 20 for the rectifier 18. The rectifier 18 then opens in gate-like fashion to cause power to flow in the loop I, whereby a controlled power output signal is provided between the contact O and ground.

With contact P at a positive potential with respect to ground, contact O (with respect thereto) is at a negative potential, there being a voltage drop across $R_F$. This causes the capacitor $C_F$ to charge to equal the voltage that develops across the resistor $R_F$. With the negative potential appearing at contact O being applied through the trigger circuit biasing resistor $R_B$, the emitter of the now conducting transistor 12 has its operating point rise to a point where it will conduct for a lower signal level than the one which had first been applied to drive it into conduction. This being the case, gradually decreasing the level of the input signal to the transistor 12 causes such transistor to drop out of conduction for a signal level which is not the same as that which started it conducting, but which is in fact lower. In dropping out of conduction, the collector of the transistor 12 rises positively in potential causing the base of the transistor 14 to rise to a point where the transistor 14 turns back on to its normally conducting state. When this occurs, the voltage at the collector drops to a point where the zener diode 16 ceases to conduct, thereby causing the control rectifier 18 to cease conducting power to contact O.

At the instant the transistor 12 turns off and ceases conducting, causing as aforesaid the transistor 14 to inch in the direction of again conducting, the capacitor $C_F$ begins discharging. This works to keep the point O momentarily negative. Hence, at the very instant when a negative bias potential is needed at the emitter of the transistor 14 to enhance the driving of same into conduction, such is provided. And this is, by the way, by means of the very components which had served to lower the signal level at which power is removed from the point O.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. A circuit adapted to apply and remove power from a controllable device comprising threshold means, a Schmitt trigger circuit having a normally conducting section and a normally nonconducting section, the output signal from the normally conducting section being applied to said threshold means but being normally insufficient to cause that means to provide an output signal, said normally nonconducting section being adapted to have applied thereto a control signal which when of a particular first predetermined level causes said normally nonconducting section to conduct and said normally nonconducting section to cease conducting, whereby the output signal from said normally conducting section rises rapidly to a point sufficient to cause the threshold means to provide an output signal, gate means responsive to the output signal from said threshold means to pass power therethrough, and means responsive to the power that passes through said gate means to provide a bias signal, said signal being applied to said normally nonconducting section to lower the control signal level for which it conducts.

2. The apparatus of claim 1 wherein said threshold means is a zener diode.

3. The apparatus of claim 1 wherein said gate means is a control rectifier.

4. A circuit adapted to apply and remove power from a controllable device comprising threshold means, a Schmitt trigger circuit having a normally conducting transistor, a normally nonconducting transistor, and common resistor means in the emitter circuits of both transistors, the output signal from the normally conducting transistor being applied to said threshold means but being normally insufficient to cause that means to provide an output signal, said normally nonconducting transistor being adapted to have applied thereto a control signal which when of a particular first predetermined level with respect to ground causes said normally nonconducting transistor to conduct and said normally nonconducting transistor to cease conducting, whereby the output signal or said normally conducting transistor rises rapidly to a point sufficient to cause the threshold means to provide an output signal, gate means responsive to the output signal from said threshold means to pass power therethrough, bias resistor means means being serially connected at one end to said gate means and to ground, and capacitor means connected in parallel with said resistor means and in series with said common resistor means, whereby a bias signal is applied when power passes through said gate means to lower the control signal level for which the normally nonconducting transistor will turn off.

5. The apparatus of claim 4 wherein the threshold means is a zener diode so connected to the collector of the normally conducting transistor that the diode normally is nonconductive, and wherein said gate means is a control rectifier adapted to have its cathode connected to ground and its anode connected to a source of positive potential.

References Cited by the Examiner

UNITED STATES PATENTS

| | | | |
|---|---|---|---|
| 3,097,314 | 7/1963 | Harriman ---------- | 307—88.5 |
| 3,166,678 | 1/1965 | Fleshman ---------- | 307—88.5 |

ARTHUR GAUSS, *Primary Examiner*.